United States Patent
Ohishi

(10) Patent No.: US 7,259,836 B2
(45) Date of Patent: *Aug. 21, 2007

(54) STAGE DEVICE FOR POSITIONING AN OBJECT, IN WHICH A STATIC PRESSURE BEARING AND A PRESSURIZING MAGNET SUSPEND A SLIDER

(75) Inventor: Shinji Ohishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/434,104

(22) Filed: May 16, 2006

(65) Prior Publication Data

US 2006/0203223 A1    Sep. 14, 2006

Related U.S. Application Data

(62) Division of application No. 10/947,288, filed on Sep. 23, 2004, now Pat. No. 7,088,429.

(30) Foreign Application Priority Data

Oct. 3, 2003   (JP) .............................. 2003-345891

(51) Int. Cl.
G03B 27/62 (2006.01)
G03B 27/42 (2006.01)
H02N 3/00 (2006.01)

(52) U.S. Cl. ............................. 355/75; 355/53; 310/10

(58) Field of Classification Search ................. 355/53, 355/72, 75; 374/34; 310/12, 10; 318/628, 318/649; 378/34
See application file for complete search history.

(56) References Cited

U.S. PATENT DOCUMENTS

| 5,260,580 | A | 11/1993 | Itoh et al. ................ 250/492.2 |
| 5,666,038 | A | 9/1997 | Ohishi ........................ 318/625 |
| 5,684,856 | A | 11/1997 | Itoh et al. ..................... 378/34 |
| 5,982,128 | A | 11/1999 | Lee ........................ 318/568.16 |
| 6,408,045 | B1 | 6/2002 | Matsui et al. ................. 378/34 |
| 6,635,887 | B2 * | 10/2003 | Kwan et al. ............. 250/491.1 |
| 2001/0015799 | A1 | 8/2001 | Asano et al. ................. 355/72 |
| 2001/0028449 | A1 | 10/2001 | Miyajima et al. ............. 355/72 |

FOREIGN PATENT DOCUMENTS

JP         2000-77503       3/2000

\* cited by examiner

Primary Examiner—Alan A. Mathews
(74) Attorney, Agent, or Firm—Fitzpatrick, Cella, Harper & Scinto

(57) ABSTRACT

A stage device for positioning an object. The stage device includes a slider for holding the object, a driving section for driving the slider with respect to a base, wherein the slider is supported in a suspended state on the base by a static-pressure bearing and a pressurizing magnet, and a countering section for holding the driving section and canceling a reaction force that acts upon the driving section. The countering section is supported in a suspended state on the base by a static-pressure bearing and a pressurizing magnet. Also, the relation $Fm=Fa+Fg$ is satisfied, wherein $Fm$ represents the attraction force of the magnet, $Fg$ the weight of the stage, and $Fa$ the pressure produced by the static-pressure bearing.

17 Claims, 8 Drawing Sheets

STAGE DEVICE FOR POSITIONING AN OBJECT, IN WHICH A STATIC PRESSURE BEARING AND A PRESSURIZING MAGNET SUSPEND A SLIDER

This application is a divisional application of U.S. patent application Ser. No. 10/947,288, filed Sep. 23, 2004 now U.S. Pat. No. 7,088,429.

FIELD OF THE INVENTION

This invention relates to a stage device used in a machine tool or in an exposure apparatus, which is employed in a semiconductor manufacturing process, in order to position an object to be measured or an object to be worked, such as a wafer or reticle.

BACKGROUND OF THE INVENTION

FIG. 6 is a diagram schematically illustrating the structure of a stage device according to an example of the prior art. This diagram exemplifies the structure of a reticle stage for positioning a reticle when a semiconductor is manufactured (for example, see the specification of Japanese Patent Application Laid-Open No. 2000-77503).

The reticle stage shown in FIG. 6 is disposed on a plumb upper surface serving as a reference surface on a stage base 101. The stage base 101 is arranged to oppose a guide 102 via bearings 103 and is guided in a traveling direction X and in a direction Y (a yaw direction) at right angles to the direction X. Ball bearings or slide bearings are used as the bearings 103, though static-pressure bearings, or the like, may be used if attitude is to be maintained with a high degree of precision.

Movable magnets 107 are disposed on both sides of a slider 104 in terms of the horizontal direction. When a current is passed into motor coils 108 opposing the movable magnets 107, the slider 104 is driven in the traveling direction. Since there are many cases wherein the slider is driven at a high acceleration in a reticle stage, or the like, often the side of the motor coil 108 is arranged as a countermass 106. The countermass 106 also is placed on the stage base 101 via the bearings 103 in similar fashion and is driven on the stage base in the direction opposite to that of the slider 104 thereby to counter or to cancel the reaction force so that oscillation externally of the stage device can be suppressed.

In the case of a semiconductor exposure apparatus that employs light (e.g., I rays, a KrF excimer laser, etc.) as a light source 109, a transmission-type reticle 105 is mounted on the slider 104 and is illuminated with light from above, whereby a circuit pattern on the reticle 105 is transferred to a wafer.

An exposure apparatus that uses EUV (extreme ultraviolet) light as the light source has become the focus of attention in recent years as a next-generation exposure apparatus. In the case of exposure using EUV light, consideration has been given to an arrangement in which a reflecting-type reticle is mounted on the plumb lower surface of the slider 104, as illustrated in FIG. 7.

With the above-mentioned exposure apparatus that uses EUV light, the reticle 105 is disposed on the lower surface of the slider 104. Consequently, in order to illuminate the reflective surface of the reticle 105 with EUV light that impinges obliquely with respect to the horizontal direction, it is necessary that the stage base 101 be provided with an opening through which the light can pass.

In the arrangement of FIG. 7, however, the optical path and the stage base 101 interfere. In order to avoid such interference, therefore, it is required that the countermass 106 be disposed farther toward the outer side. This leads to an increase in the size of the stage device.

Further, with the arrangement in which the stage base 101 is provided with the opening, there is the danger that the stage base 101 will be deformed owing to inadequate rigidity. If the stage base 101 is deformed owing to driving of the slider 104 at a high acceleration, the guide surface will be deformed. As a result, the attitude of the stage cannot be maintained and it will become difficult to achieve highly accurate positioning.

SUMMARY OF THE INVENTION

Accordingly, an object of the present invention is to provide a stage device that is capable of highly accurate positioning without any increase in the size thereof, wherein when the stage device is applied to, e.g., an exposure apparatus that performs exposure by causing exposing light to be reflected by a reflecting-type reticle, there are not interfering objects on the optical path and it is unnecessary to provide a configuration having openings, or the like, to assure the optical path.

According to the present invention, the foregoing object is attained by providing a stage device, for positioning an object, comprising a slider for holding the object and a driving section for driving the slider with respect to a base, wherein the slider is supported in a suspended state on the base by a static-pressure bearing and a pressurizing magnet.

Preferably, the device further includes a countering section for holding the driving section and canceling a reaction force that acts upon the driving section, wherein the countering section is supported in a suspended state on the base by a static-pressure bearing and a pressurizing magnet.

Preferably, the relation Fm=Fa+Fg is satisfied, where Fm represents the attraction force of the magnet, Fg the stage's own weight and Fa the pressure produced by the static-pressure bearing.

Preferably, the device further includes adjusting means for adjusting the attraction force of the magnet and the pressure produced by the static-pressure bearing.

Preferably, the device further includes measuring means for measuring an amount of levitation of the static-pressure bearing with respect to the base.

Preferably, the device further includes a guide portion for electromagnetically driving the slider in a predetermined direction.

Preferably, the guide portion includes a first core portion having a C-shaped cross section and extending in the predetermined direction, and a second core portion centered on the first core portion and arranged to oppose the first core portion from both sides thereof, wherein a cable and connector for passing current are disposed in a U-shaped space of the first core section.

Further, an exposure apparatus according to the present invention uses any of the stage devices described above, wherein an original is positioned relative to a substrate using the stage device, whereby the substrate is exposed to a pattern formed on the reticle.

Further, the present invention is applicable to a device manufacturing method for manufacturing a device using the exposure apparatus.

In accordance with the present invention, as described above, it is possible to construct a stage device that is capable of highly accurate positioning without any increase in the size thereof, wherein when the stage device is applied to, e.g., an exposure apparatus that performs exposure by causing exposure light to be reflected by a reflecting-type reticle, there are not interfering objects on the optical path and it is unnecessary to provide a configuration having openings, or the like, to assure the optical path.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENT

A preferred embodiment of the present invention will now be described in detail with reference to the accompanying drawings.

[Exposure Apparatus]

Figure 1:
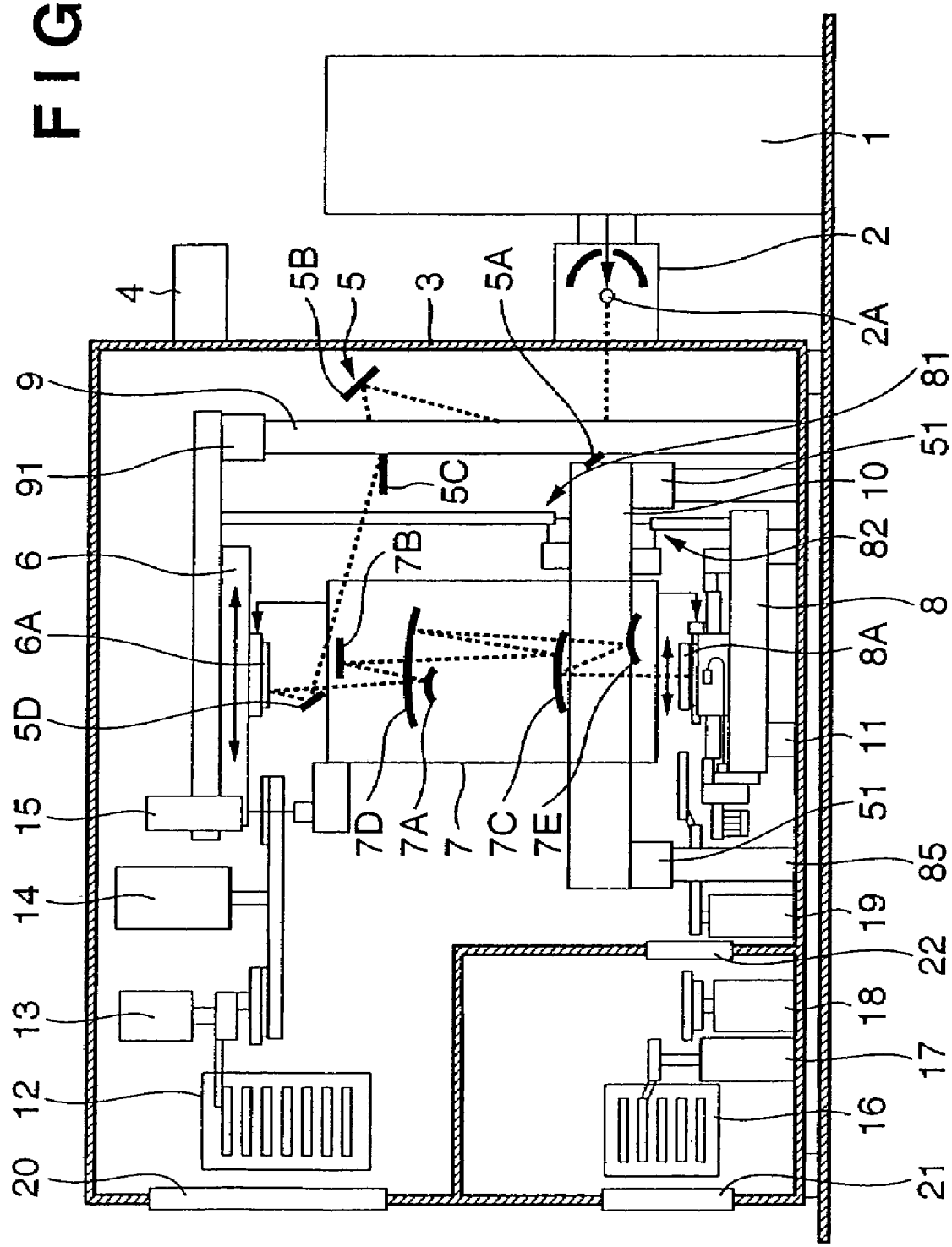
FIG. 1 is a diagram illustrating the structure of an exposure apparatus on which a stage device according to an embodiment of the invention is mounted.

FIG. 1 is a diagram illustrating the structure of an exposure apparatus on which a stage device according to an embodiment of the invention is mounted.

As shown in FIG. 1, the apparatus includes an excitation laser 1. The laser irradiates a point at which a light-source material serving as the light-emission point of a light source has been gasified, liquefied or atomized, thereby subjecting the atoms of the light-source material to plasma excitation so that EUV light is emitted. In this embodiment, a YAG solid-state laser is used as the excitation laser 1.

A light-source light-emitting unit 2 has a structure in which the interior of the unit is held in a vacuum. A light source 2A within the unit indicates the actual light-emission point. A light-source mirror is provided at the periphery of the light source 2A so that all of the spherical light from the light source 2A will be condensed and reflected in the direction of the light emission, thereby generating the exposure light. The light-source mirror is disposed as a hemispherical mirror, the center of which is the position of the light source 2A. Liquefied Xe, liquefied Xe in the form of a mist or Xe gas, which serves as the light-emission element, is supplied to the position of the light source 2A from a nozzle, not shown.

A vacuum chamber 3 serving as an environmental chamber accommodates the entire exposure apparatus. A vacuum pump 4 evacuates the interior of the vacuum chamber 3 to maintain a vacuum within. An exposing-light introduction unit 5 introduces and shapes the exposing light from the light-source light-emitting unit 2. The exposing-light introduction unit 5 comprises mirrors 5A to 5D for making uniform and shaping the exposed light.

A reticle stage 6 has a slidable portion on which is mounted a reflecting-type reticle (or mask) 6A, which is a reflecting original plate of an exposure pattern. A demagnifying projection-mirror optical system 7 serves as a projecting lens in a projecting system. The exposing pattern formed by the exposure light reflected at the reticle 6A is demagnified and projected onto a wafer 8A by the optical system 7. In the demagnifying projection-mirror optical system 7, the exposure light is projected and reflected in the order of mirrors 7A, 7B, 7C (on the side of reticle 6A) and 7D, 7E, 7F (on the side of wafer 8A). The image of the exposure pattern is finally projected onto the wafer 8A upon being demagnified at a prescribed demagnification ratio.

The mirrors 5A to 5D of the exposing-light introduction unit 5 for forming and shaping the exposure light from the light-source light-emitting unit 2 and the mirrors 7A to 7E of the demagnifying projection-mirror optical system 7 have reflecting surfaces on which a multilayer film of Mo—Si has been formed by vacuum deposition or sputtering. Each of these reflecting surfaces reflects the exposure light from the light source.

A wafer stage 8 mounts a wafer 8A serving as a substrate. The image of the exposure pattern on the mask 6A is reflected, demagnified and projected onto a wafer 8A, which is an Si substrate. In order to position the wafer 8A at a prescribed exposure position, the wafer stage 8 is positionally controlled with a six-axis drive capability, namely, by being driven along the X, Y, and Z axes, tilted ($\omega x$, $\omega y$) about the X and Y axes and rotated ($\theta$) about the Z axis.

A mask-stage supporting body 9, which is disposed inside the vacuum chamber 3, supports a mask-stage base of the mask stage 6 via a vibration-proof mount 91 serving as a vibration-proof mechanism disposed within the vacuum chamber 3. The mask-stage supporting body 9 is secured to the floor of the vacuum chamber 3. The invention is not limited to this arrangement and it may be so arranged that support is provided from the floor on which the entirety of the exposure apparatus inclusive of vacuum chamber 3 is installed.

The vibration-proof mount 91, which includes a damper or actuator that utilizes air as the working gas, vibrationally isolates the mask-stage base of the mask stage 6 and the mask-stage supporting body 9.

Lens-tube base supports 85 are disposed inside the vacuum chamber 3 and support a lens-tube base 10, which holds the lens tube of the optical system 7, via a vibration-proof mount 51 serving as a vibration-proof device disposed within the vacuum chamber 3. The lens-tube base supports 85 are secured to the floor of the vacuum chamber 3. The invention is not limited to this arrangement and it may be so arranged that support is provided from the floor on which the entirety of the exposure apparatus inclusive of the vacuum chamber 3 is installed.

The vibration-proof mount 51, which includes a damper or actuator that utilizes air as the working gas, vibrationally isolates the lens-tube base 10 and lens-tube base supports 85.

A vibration-proof mount 11, serving as a vibration-proof device, is disposed inside the vacuum chamber 3. The vibration-proof mount 11 supports the wafer-stage base of the wafer stage 8 with respect to a wafer-stage support (not shown) secured to the floor of the vacuum chamber 3. The invention is not limited to this arrangement, and it may be so arranged that support is provided from the floor on which the entirety of the exposure apparatus, inclusive of the vacuum chamber 3, is installed.

The vibration-proof mount 11, which includes a damper or actuator that utilizes air as the working gas, vibrationally isolates the wafer-stage base and the mask-stage base supporting body.

As shown in FIG. 1, the reticle stage 6 (and/or mask-stage base), optical system 7 (and/or lens-tube base 10) and wafer stage 8 (and/or wafer-stage base) are each situated inside the vacuum chamber 3 in a state vibrationally isolated with respect to the vacuum chamber 3 or floor of installation via the vibration-proof mounts 91, 51, 11, respectively. Further, the reticle stage 6 (and/or reticle-stage base), optical system 7 (and/or lens-tube base 10) and wafer stage 8 (and/or wafer-stage base) are each supported, separately and independently, by the vibration-proof mounts 91, 51, 11, respectively, and are vibrationally isolated with respect to one another.

When the image of the pattern on the reticle 6A is projected upon and exposed to an area on the wafer 8A via the optical system 87, the exposure apparatus of FIG. 1 moves the reticle stage 6 and wafer stage 8 in the direction of the arrows shown in FIG. 1, thereby performing scanned exposure, while the stages are synchronized. Further, since the areas on the wafer 8A are exposed one after another while stepping motion and scanned exposure are repeated, this apparatus generally is referred to as a "step-and-scan"-type apparatus.

A reticle stacker 12 stores the mask 6A, which is received from outside the apparatus (vacuum chamber 3), inside the apparatus, temporarily. The reticle stacker 12 stores a plurality of masks, which conform to different patterns and different exposure conditions, in a storage vessel, in a hermetically sealed state. A mask to be used is selected and transported by a reticle changer 13.

A reticle alignment unit 14 has a rotational hand, which is movable along the X, Y, and Z axes, and rotated (through the angle θ) about the Z axis. The reticle alignment unit 14 accepts a reticle 6A through an angle of 180° in the field of view of a reticle alignment scope 15 provided at the edge of the reticle stage 6 and aligns the reticle 6A with an alignment mark, which is provided as a reference for the optical system 7, by finely moving it along the X and Y axes and about the Z axis (through the angle θ). That is, by finely moving and adjusting the reticle 6A along the X and Y shift directions and about the Z axis (through the angle θ), an alignment mark on the reticle 6A is made to agree with the alignment mark provided as a reference for the optical system 7. When the reticle 6A is thus fixed to the reticle stage, the reticle 6A will be in alignment with the optical system 7 serving as the projection reference. The reticle 6A, whose alignment has thus been completed, is chucked on the reticle stage 6.

A wafer stacker 16 stores the wafer 8A, which is received from outside the apparatus (vacuum chamber 3), inside the apparatus, temporarily. The wafer stacker 16 stores a plurality of wafers in a storage vessel. A wafer transport robot 17 selects a wafer to be exposed and processed from the wafer stacker 16 and carries it to a temperature regulator 18 for mechanical pre-alignment of the wafer. The pre-alignment temperature regulator 18 performs coarse adjustment of feed-in of the wafer 8A in the direction of rotation and, at the same time, brings the temperature of the wafer into conformity with the regulated temperature within the exposure apparatus. A wafer feed-in hand 19 feeds a wafer, which has undergone alignment and temperature regulation in the pre-alignment temperature regulator 18, to the wafer stage 8.

Gate valves 20 and 21 constitute a gate open/close mechanism for inserting reticles and wafers introduced from outside the apparatus (vacuum chamber 3). A similar gate valve 22 isolates the space of the wafer stacker 16 and pre-alignment temperature regulator 18 from the exposure space by means of a partitioning wall and is opened and closed only when a wafer is carried in or out (referred to generically as "transport"). By thus achieving isolation by partitioning, the volume that is opened to the atmosphere is minimized when a wafer is transported between the interior and the exterior of the apparatus, thereby making it possible to restore the apparatus to a vacuum state, rapidly.

[Stage Device (Reticle Stage)]

Figure 2:
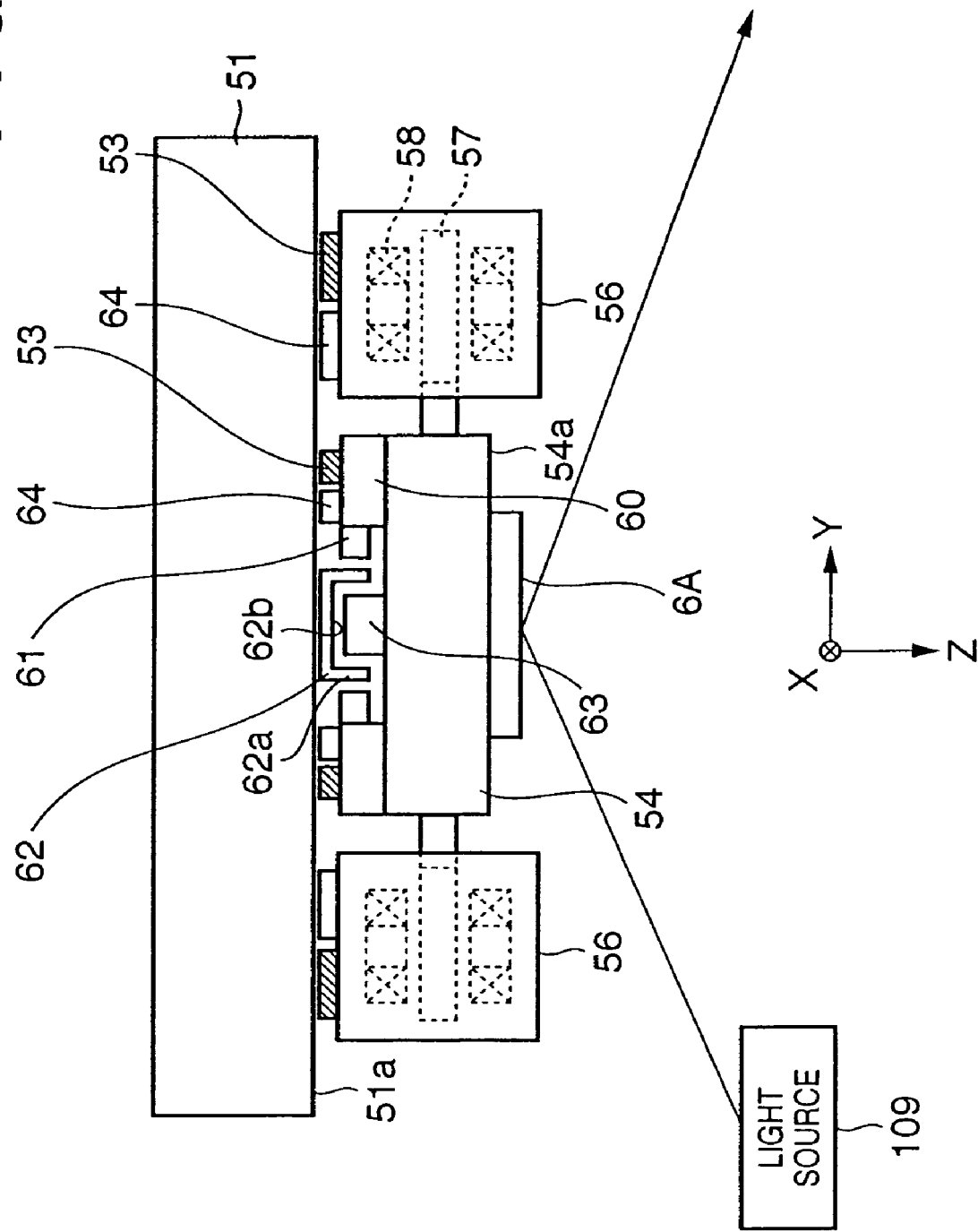
FIG. 2 is a diagram illustrating the structure of the stage device of this embodiment.
Figure 3:
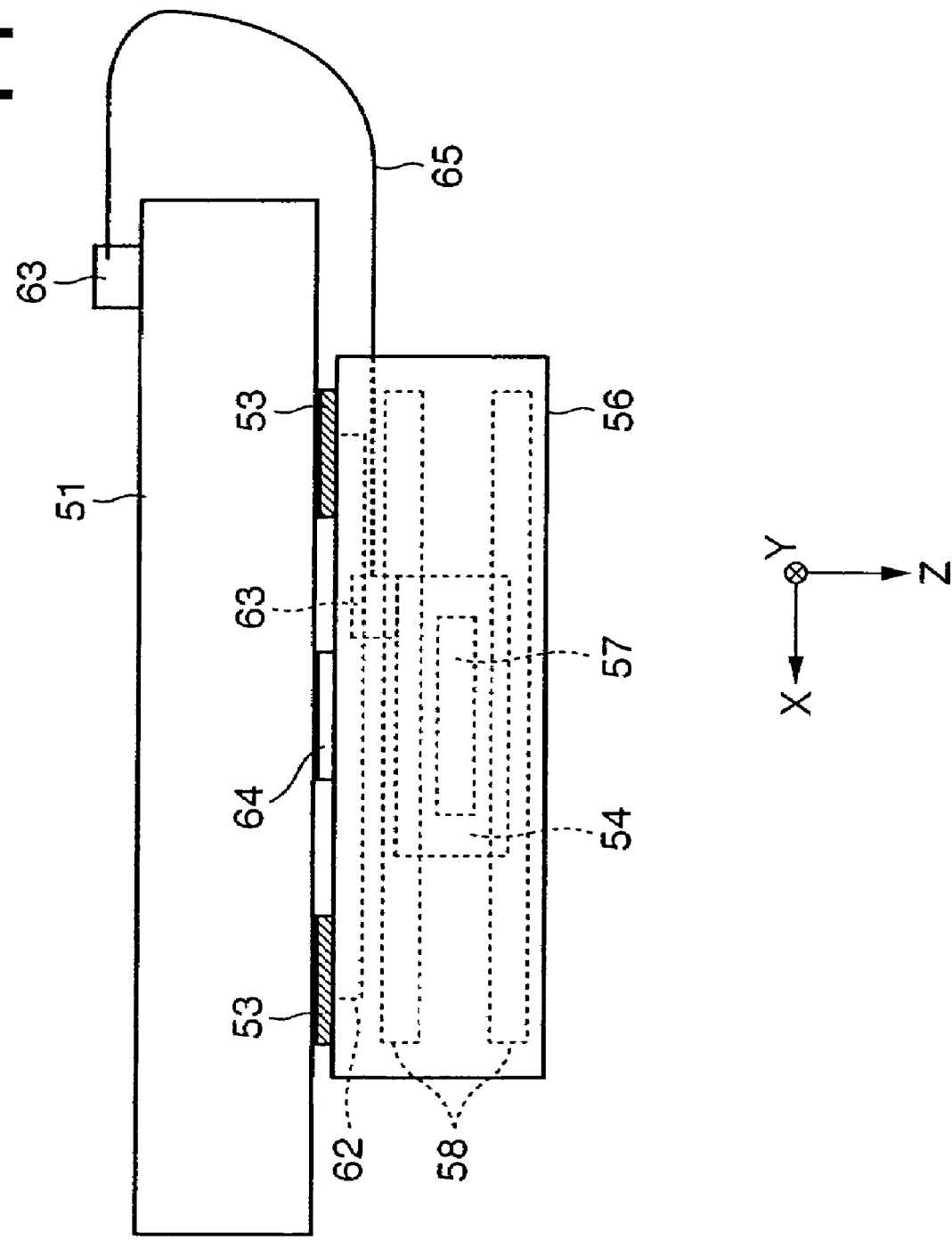
FIG. 3 is a side view of the stage device of FIG. 2 as viewed from the Y direction.
Figure 4:
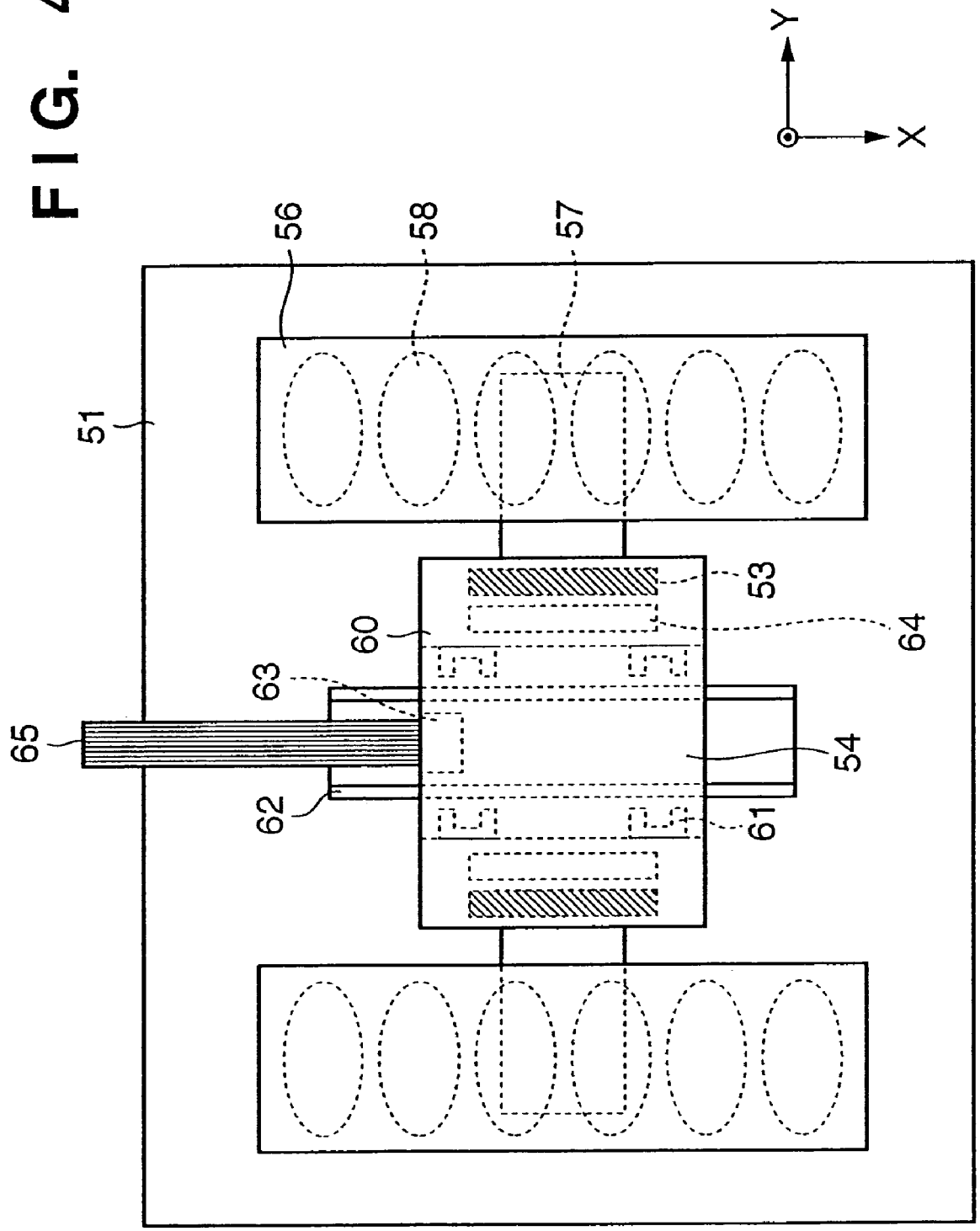
FIG. 4 is a side view of the stage device of FIG. 2 as viewed from below.

FIG. 2 is a diagram schematically illustrating the structure of the stage device according to this embodiment, FIG. 3 is a side view of the stage device of FIG. 1 as viewed from the Y direction, and FIG. 4 is a side view of the stage device of FIG. 1 as viewed from below.

The stage device exemplified in FIGS. 2 to 4 is constructed as the reticle stage 6 mounted on the exposure apparatus described above. The device stage is suspended from a plumb lower surface 51a serving as a reference surface on a stage base 51, and has a stage surface 54a for holding the reticle 6A in a slider 54. The stage device is held in a contactless state on the plumb lower surface 51a of the stage base 51 by the attraction force of a pressurizing magnet 64 in such a manner that the stage surface 54a will be directed vertically downward (along the Z direction, which is perpendicular to the XY plane parallel to the plumb lower surface 51a of the stage base 51).

More specifically, the stage device includes the slider 54 holding the reticle 6A serving as the original plate, a movable magnet 57 and motor coil 58 serving as a drive mechanism for driving the slider 54 along mutually perpendicular first and second directions (the first direction is the X direction, which is parallel to the plumb lower surface 51a of the stage base 51, and the second direction is the Y direction, which is perpendicular to the X direction parallel to the plumb lower surface 51a of the stage base 51), and a countermass 56 serving as a countering portion for holding the motor coil 58 and canceling a reaction force that acts upon the motor coil 58 when the movable magnet 57 is driven.

The movable magnet 57 is provided at each end of an arm extending along the Y direction from both sides of the slider 54, and the motor coil 58 is disposed so as to oppose the movable magnet 57 from above and below. The slider 54 is driven along the X direction by passing a current through the motor coil 58.

A foot 60 is provided on both ends of the slider 54 along the Y direction, and a static-pressure bearing 53 is provided on the upper surface of each foot 60. The slider 54 is supported on the plumb lower surface 51a of the stage base 51 in contactless fashion by the static-pressure bearings 53. Further, the countermass 56 is supported on the stage base 51 by static-pressure bearings 53 provided on its upper surface.

The pressurizing magnet 64 is provided on the upper surface of each foot 60 and on the upper surface of each countermass 56 in close proximity to the static-pressure bearing 53. The slider 54 and countermass 56 are attracted to and held on the plumb lower surface 51a of the stage base 51 by the magnetic attraction force of the pressurizing magnet 64 in such a manner that they will not fall under their own weight.

When the above-described stage device is supplied to the reticle stage 6 of an exposure apparatus, it is often driven under high acceleration. In many cases, therefore, the side of the motor coil 58 is constructed as the countermass 56, as in this embodiment. The countermass 56, while being held on the stage base 51 by the attraction force of the pressurizing magnet 64, cancels a reaction force on the plumb lower surface 51a of the stage base 51 by being driven in the direction opposite to that of the slider 54.

Guides 61, 62 are provided on the upper surface of the slider 54 so as to be embraced by the feet 60. The slider 54 is driven electromagnetically along the Y direction (yaw direction) relative to the stage base 51. The guide portion has an electromagnetic guiding I core 62 serving as a first core portion and an electromagnetic guiding E core 61, about which has been wound, serving as a second core portion. The electromagnetic guiding I core 62, which has a C-shaped cross section, extends along the X direction and is attached to the stage base 51 in such a manner that its recessed portion faces downward. The electromagnetic guiding E core 61, which is centered on the electromagnetic guiding I core 62, is disposed so as to oppose side walls 62a of the core 62. A mounting cable 65 and connector 63 for feeding current are placed inside a U-shaped space 62b of the electromagnetic guiding I core 62.

As shown in FIG. 3, the mounting cable 65 is led out from the connector 63 placed in the U-shaped space of the electromagnetic guiding I core 62 and is formed into a loop so that it will not disturb the slider 54. The mounting cable 65 is connected to a connector 63 disposed on the stage base 51.

Further, as shown in FIG. 4, the electromagnetic guiding I core 62 is placed at the center of the stage base 51 in terms of the Y direction, and the mounting cable 65 also is similarly situated at the center of the stage base 51. Since the slider 54 is driven uniaxially along the X direction without yawing, situating the cable 65 at the center assures that a θ disturbance ascribable to an external force from the cable will not readily be transmitted to the slider 54.

Preferably, the stage device having the above-described structure is mounted on an EUV exposure apparatus that moves and positions the reflecting-type reticle 6A under irradiation with EUV light from the light-source light-emitting unit 2. That is, since there is no object on the optical path of the EUV light that will block the optical path, there will be no interference between the stage base 51 and the optical path of the EUV light projected from the light-source light-emitting unit 2 in the EUV exposure apparatus, as occurs in the prior art, and, therefore, the circuit pattern on the reticle 6A mounted on the slider 54 can be transferred accurately to the wafer, not shown.

Furthermore, the stage base 51 need not be provided with a configuration having an opening, or the like. As a result, the apparatus is not increased in size and can be positioned with high precision.

Figure 5:
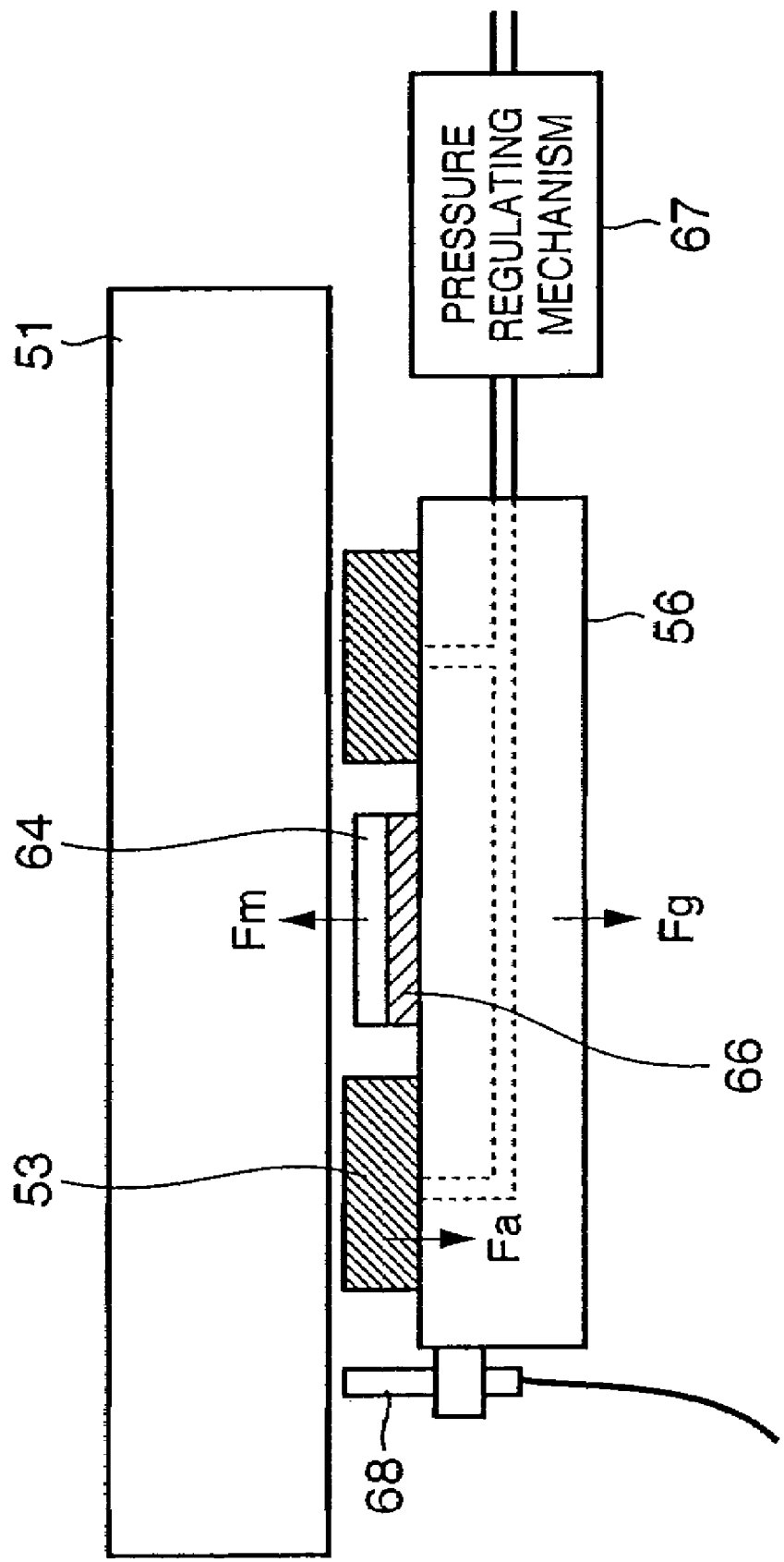
FIG. 5 is a diagram for describing the structure of a static-pressure bearing that supports a slider and a countermass.
Figure 6:
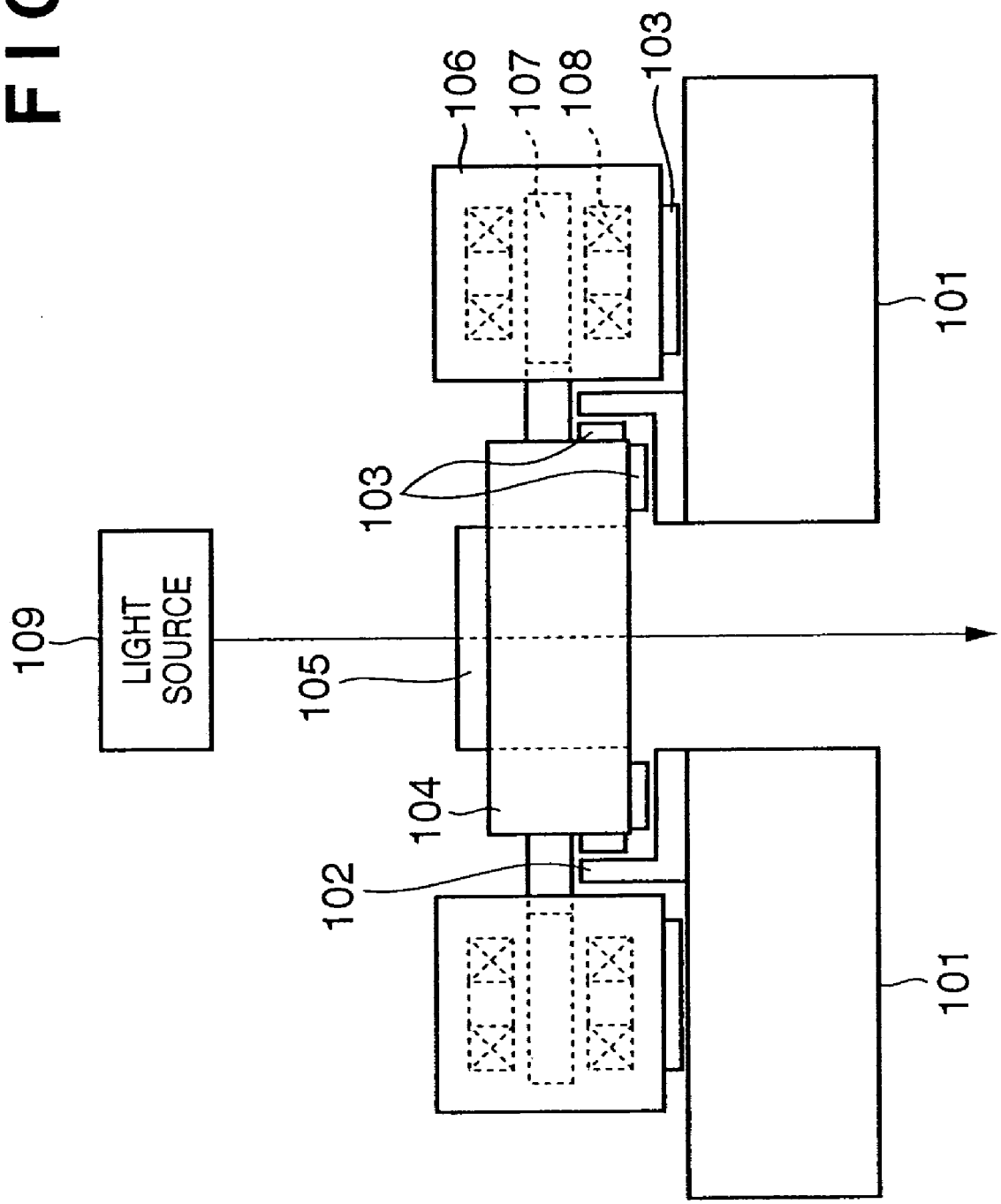
FIG. 6 is a diagram illustrating the structure of a stage device according to an example of the prior art.
Figure 7:
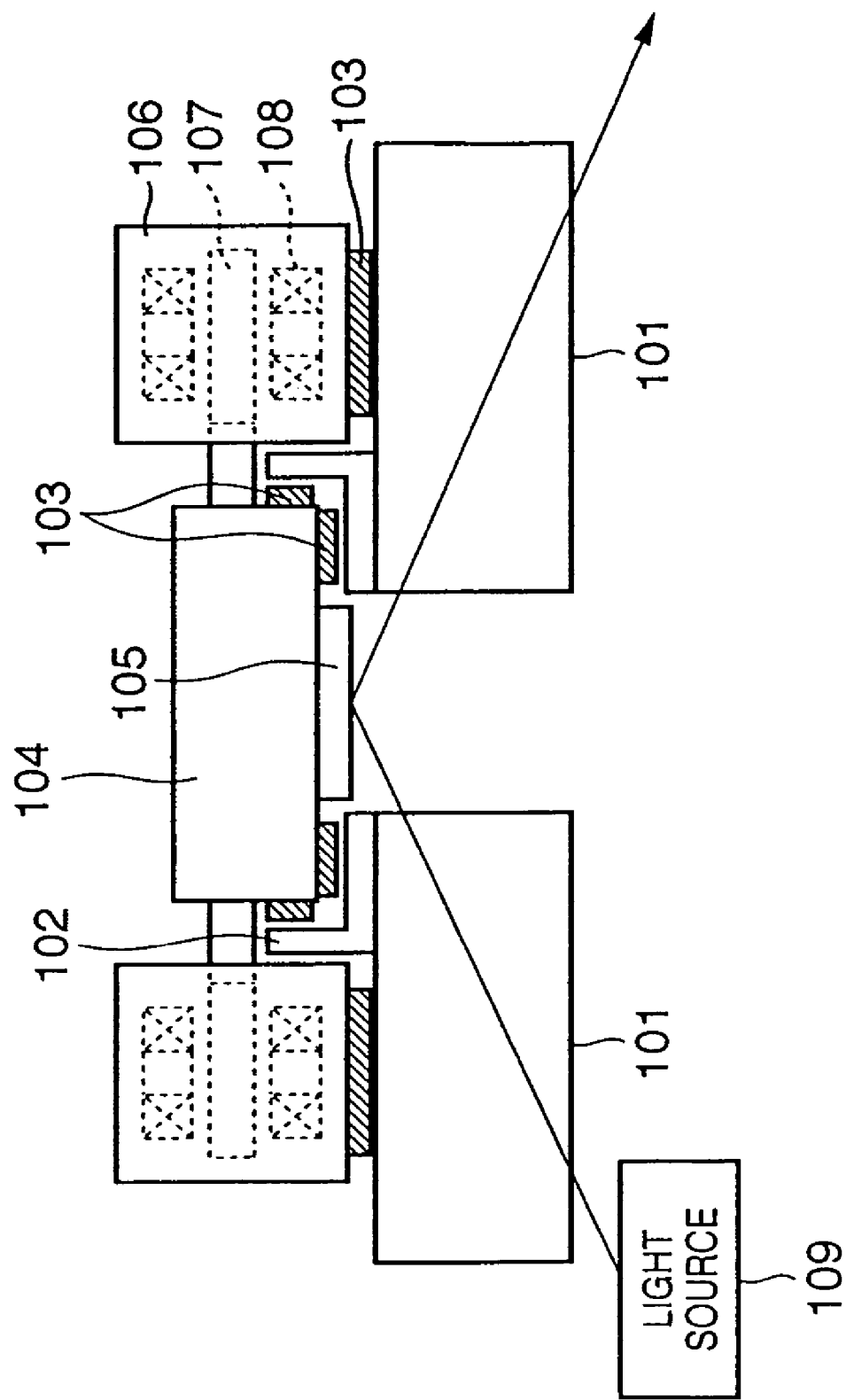
FIG. 7 is a diagram illustrating the structure of a stage device according to another example of the prior art.

FIG. 5 is a diagram for describing the structure of a static-pressure bearing that supports the slider and countermass.

It is presumed that the stage device will be used in a vacuum environment. The static-pressure bearing 53 is supplied with a gas (or fluid resembling a gas) from an external gas supply source (not shown), whereby the gas, which is under a prescribed pressure, is fed into the space between the bearing and the plumb lower surface 51a of the stage base 51. As a result, the slider 54 and countermass 56 are neutrally levitated and supported in a contactless state.

A downwardly acting pressure Fa (namely, pressure directed away from the stage base 51), produced by the static-pressure bearing (pad) 53, depends on the supply pressure and can be regulated by a pressure regulating mechanism 67, such as a precision regulator. The pressurizing magnet 64 produces an attraction force Fm that acts upon the stage base 51. The attraction force Fm is capable of being regulated by changing the gap between the stage base 51 and the magnet by a height adjusting mechanism 66 comprising a spacer, or the like. A force Fg in the falling direction ascribable to the weight of the slider 54 and countermass 56 acts upon the slider and countermass.

It is required that the pressure regulating mechanism 67 adjusts the amount of levitation (gap) of the static-pressure lens to several microns while maintaining the relation Fm=Fa+Fg in order that the attraction force Fm of the pressurizing magnet 64 and force Fa produced by the static-pressure bearing 53 will be adjusted. To achieve this, a displacement sensor 68 is provided on the slider 54 and the pressure Fa is adjusted while the distance between the slider 54 and the stage base 51 is measured. This makes it possible to adjust the amount of levitation to the optimum value.

The stage device applied to the EUV exposure apparatus is placed in a vacuum chamber. A high-vacuum environment can be dealt with by employing a static-pressure bearing pad equipped with an exhaust groove.

It should be noted that the above-described stage device is not limited to use in an exposure apparatus introduced in a process for manufacturing semiconductors. The stage device is also applicable to a machine tool for moving and positioning an object undergoing measurement.

[Device Manufacturing Method]

A process for manufacturing a semiconductor device utilizing the exposure apparatus set forth above will now be described.

Figure 8:
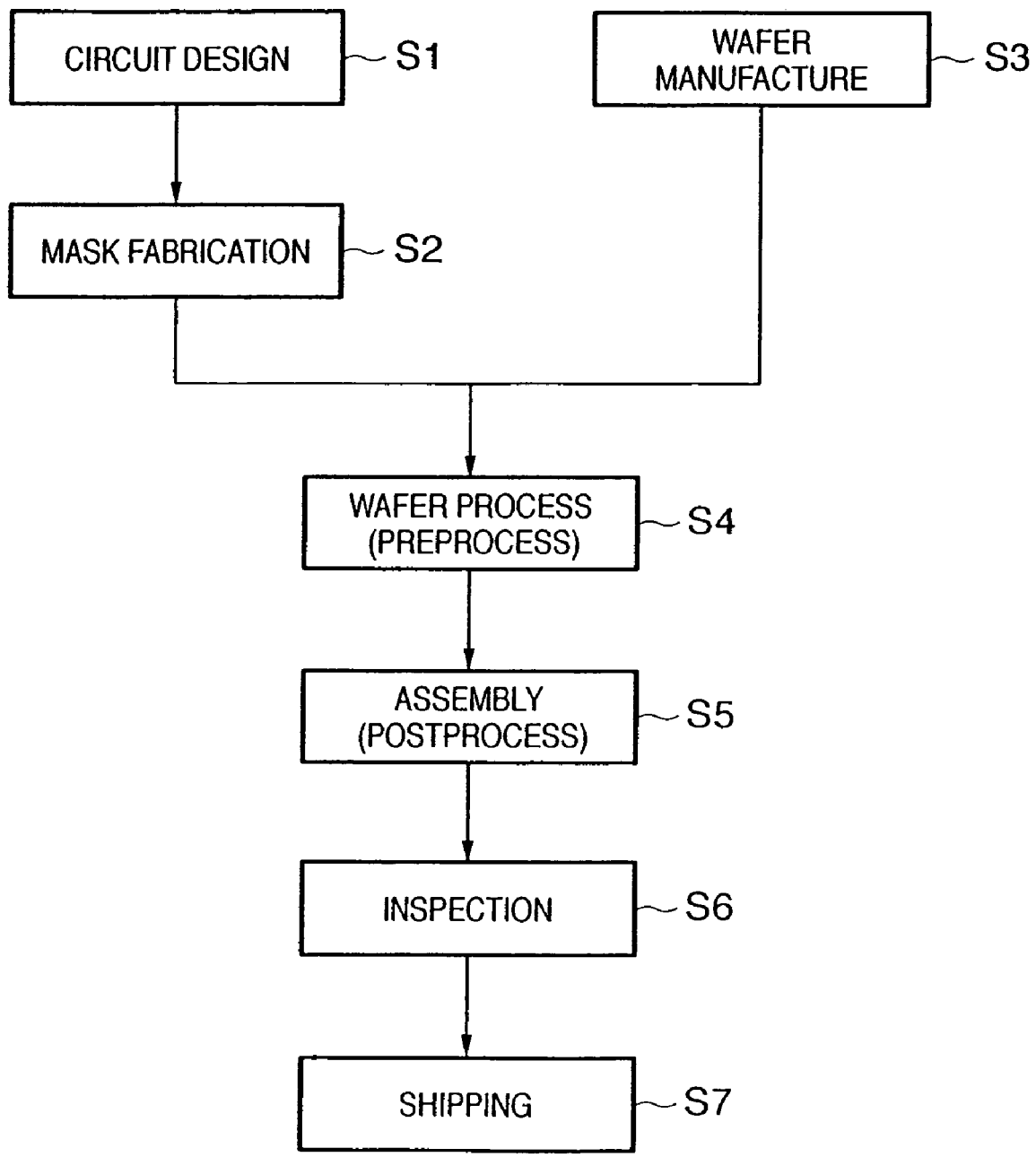
FIG. 8 is a diagram illustrating the overall flow of a process for manufacturing a semiconductor device.

FIG. 8 is a flowchart illustrating the overall manufacturing process of a semiconductor device. The circuit of the semiconductor device is designed at step S1 (circuit design). A mask is fabricated at step S2 (mask fabrication), based upon the circuit pattern designed.

A wafer is manufactured using a material, such as silicon, at step S3 (wafer manufacture). At step S4 (wafer process), which is referred to as a preprocess, an actual circuit is formed on the wafer by the above-described exposure apparatus utilizing lithography and using the above-described mask and wafer. At step S5 (assembly), which is referred to as a postprocess, semiconductor chips are formed from the wafer fabricated at step S4. This postprocess includes an assembly process (dicing and bonding) and a packaging process (chip encapsulation). The semiconductor device fabricated at step S5 is subjected to inspections such as a test for confirmation of operation and a test of durability at step S6 (inspection). These steps are executed to complete the manufacture of the semiconductor device, which is shipped at step S7.

The wafer process of step 4 above has the following steps: an oxidizing step of oxidizing the surface of the wafer, a CVD step of forming an insulating film on the wafer surface, an electrode forming step of forming electrodes on the wafer by vapor deposition, an ion implantation step of implanting ions in the wafer, a resist treatment step of coating the wafer with a photoresist, an exposure step of transferring the circuit pattern to the wafer by the above-described exposure apparatus after the resist treatment step, a developing step of developing the wafer exposed at the exposure step, an etching step of etching away portions other than the photoresist developed at the developing step, and a resist removing step of removing unnecessary resist left after etching is performed. Multiple circuit patterns are formed on the wafer by implementing these steps repeatedly.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-345891 filed on Oct. 3, 2003, which is hereby incorporated by reference herein.

What is claimed is:

1. An EUV exposure apparatus, comprising:
a slider configured to hold an original and to move the original in a horizontal direction;
an optical system configured to irradiate exposure light vertically to the original from below;
a base having a guide surface for guiding the slider in the horizontal direction;
a first static-pressure bearing arranged to the slider and configured to supply gas between the slider and the base; and
a first pressurizing magnet configured to produce a magnetic attraction force between the slider and the base,
wherein the slider is configured so that a surface holding the original of the slider is directed vertically downward, the base is configured so that the guide surface is directed vertically downward, and the weight of the slider is supported by the magnetic attraction force.

2. The apparatus according to claim 1, further comprising adjusting means for adjusting the attraction force of the first pressurizing magnet and the force produced by the first static-pressure bearing.

3. The apparatus according to claim 1, further comprising measuring means for measuring an amount of levitation of the first static-pressure bearing with respect to the base.

4. The apparatus according to claim 1, wherein the EUV exposure apparatus is a scanning type, and further comprises a guide portion for electro-magnetically guiding the slider in a scanning direction.

5. The apparatus according to claim 4, wherein the guide portion includes:
(i) a first core portion having a C-shaped cross section and extending in the scanning direction; and
(ii) a second core portion centered on the first core portion and arranged to oppose the first core portion from both sides thereof,
wherein a cable and a connector for passing current are disposed in a U-shaped space of the first and second core sections.

6. The apparatus according to claim 1, further comprising:
a driver configured to drive the slider;
a countermass configured to hold a stator of the driver and to move in a direction opposite to the slider which is driven;
a second static-pressure bearing arranged to the countermass and configured to supply gas between the countermass and the base; and
a second pressurizing magnet configured to produce a magnetic attraction force between the countermass and the base,
wherein the countermass is configured to move along the guide surface, and the weight of the countermass is supported by the magnetic attraction force of the second magnet.

7. The apparatus according to claim 6, wherein a relation $Fm=Fa+Fg$ is satisfied, where Fm represents the attraction forces of the first and second pressurizing magnets, Fg the weight of the slider and the countermass, and Fa the forces produced by the first and second anti-static pressure bearings.

8. A device manufacturing method comprising the steps of:
(a) transferring a circuit pattern on an original onto a wafer with an EUV exposure apparatus, which includes:
(i) a slider configured to hold an original and to move the original in a horizontal direction;
(ii) an optical system configured to irradiate exposure light vertically to the original from below;
(iii) a base having a guide surface for guiding the slider in the horizontal direction;
(iv) a first static-pressure bearing arranged to the slider and configured to supply gas between the slider and the base; and
(v) a first pressurizing magnet configured to produce a magnetic attraction force between the slider and the base,
wherein the slider is configured so that a surface holding the original of the slider is directed vertically downward, the base is configured so that the guide surface is directed vertically downward, and the weight of the slider is supported by the magnetic attraction force; and
(b) then processing the wafer to manufacture the device, the processing step including a step of etching the wafer.

9. An EUV exposure apparatus comprising:
a slider configured to hold an original;
an optical system configured to irradiate exposure light to the original;
a driver configured to drive the slider with respect to a base; and
a countermass configured to hold a stator of the driver to move in a direction opposite to the slider which is driven,
wherein the slider and countermass are supported in a suspended state by a static-pressure bearing and pressurizing magnet, and a relation $Fm=Fa+Fg$ is satisfied, where Fm represents the attraction forces of the pressurizing magnet, Fg the weight of the slider and the countermass, and Fa the forces produced by the static-pressure bearing.

10. A stage device for positioning an object, said stage device comprising:
a slider for holding the object;
a driver configured to drive the slider with respect to a base; and
a countermass configured to hold a stator of the drive and to move in a direction opposite to the slider which is driven,
wherein the slider and countermass are supported in a suspended state by a static-pressure bearing and pressurizing magnet, and a relation $Fm=Fa+Fg$ is satisfied, where Fm represents the attraction forces of the pressurizing magnet, Fg the weight of the slider and the countermass, and Fa the forces produced by the static-pressure bearing.

11. A stage device for positioning an object, said stage device comprising:
- a slider configured to hold an original and to move the original in a horizontal direction;
- a base having a guide surface for guiding the slider in the horizontal direction;
- a static-pressure bearing arranged to the slider and configured to supply gas between the slider and the base; and
- a pressurizing magnet configured to produce a magnetic attraction force between the slider and the base,
- wherein the slider is configured so that a surface holding the original of the slider is directed vertically downward, the base is configured so that the guide surface is directed vertically downward, and the weight of the slider is supported by the magnetic attraction force.

12. The apparatus according to claim 11, further comprising:
- a driver configured to drive the slider;
- a countermass configured to hold a stator of the driver and to move in a direction opposite to the slider which is driven;
- a second static-pressure bearing arranged to the countermass and configured to supply gas between the countermass and the base; and
- a second pressurizing magnet configured to produce a magnetic attraction force between the countermass and the base,
- wherein the countermass is configured to move along the guide surface, and the weight of the countermass is supported by the magnetic attraction force of the second magnet.

13. The apparatus according to claim 12, wherein a relation Fm=Fa+Fg is satisfied, where Fm represents the attraction forces of the first and second pressurizing magnets, Fg the weight of the slider and the countermass, and Fa the forces produced by the first and second static-pressure bearings.

14. The apparatus according to claim 11, further comprising adjusting means for adjusting the attraction force of the pressurizing magnet, and the pressure produced by the static-pressure bearing.

15. The apparatus according to claim 11, further comprising measuring means for measuring an amount of levitation of the static-pressure bearing with respect to the base.

16. The apparatus according to claim 11, further comprising a guide portion for electro-magnetically guiding the slider in a predetermined direction.

17. The apparatus according to claim 16, wherein the guide portion includes:
- (i) a first core portion having a C-shaped cross section and extending in the first direction; and
- (ii) a second core portion centered on the first core portion and arranged to oppose the first core portion from both sides thereof,
- wherein a cable and a connector for passing current are disposed in a U-shaped space of the first and second core sections.

* * * * *